(12) United States Patent
Higgins, III

(10) Patent No.: US 9,287,200 B2
(45) Date of Patent: Mar. 15, 2016

(54) PACKAGED SEMICONDUCTOR DEVICE

(71) Applicant: Leo M. Higgins, III, Austin, TX (US)

(72) Inventor: Leo M. Higgins, III, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/928,876

(22) Filed: Jun. 27, 2013

(65) Prior Publication Data

US 2015/0001691 A1 Jan. 1, 2015

(51) Int. Cl.
*H01L 23/495* (2006.01)
*H01L 23/28* (2006.01)
*H01L 21/56* (2006.01)
*H01L 23/00* (2006.01)
*H01L 21/48* (2006.01)

(52) U.S. Cl.
CPC .............. *H01L 23/495* (2013.01); *H01L 21/56* (2013.01); *H01L 23/28* (2013.01); *H01L 23/49541* (2013.01); *H01L 23/49548* (2013.01); *H01L 23/49551* (2013.01); *H01L 21/4828* (2013.01); *H01L 21/4842* (2013.01); *H01L 23/49582* (2013.01); *H01L 24/16* (2013.01); *H01L 24/48* (2013.01); *H01L 24/49* (2013.01); *H01L 24/85* (2013.01); *H01L 24/97* (2013.01); *H01L 2224/0401* (2013.01); *H01L 2224/05554* (2013.01); *H01L 2224/16245* (2013.01); *H01L 2224/48247* (2013.01); *H01L 2224/48465* (2013.01); *H01L 2224/49171* (2013.01); *H01L 2224/85439* (2013.01); *H01L 2224/85444* (2013.01); *H01L 2224/85455* (2013.01); *H01L 2224/85464* (2013.01); *H01L 2924/00014* (2013.01); *H01L 2924/12042* (2013.01); *H01L 2924/15747* (2013.01)

(58) Field of Classification Search
CPC ..... H01L 23/495; H01L 23/488; H01L 23/28; H01L 21/56; H01L 23/49551; H01L 23/49548; H01L 23/49541; H01L 21/4842; H01L 24/85; H01L 241/16; H01L 24/48; H01L 24/49; H01L 24/97
USPC ................. 257/666, 698, 773, 691, 676, 675; 438/123
See application file for complete search history.

(56) References Cited

U.S. PATENT DOCUMENTS 4,494,068 A * 1/1985 Ley et al. ........................ 324/126
5,557,144 A * 9/1996 Rosenstock et al. .......... 257/668

(Continued)

FOREIGN PATENT DOCUMENTS

JP 60-254646 * 12/1985
JP 61-19204 * 1/1986

(Continued)

OTHER PUBLICATIONS

Bhandarkar, N., et al., "Low-Stress Leadframe Design for Plastic IC Packages", IEEE, 1996 Electronic Components and Technology Conference, pp. 803-807.

*Primary Examiner* — Alexander Oscar Williams

(57) ABSTRACT

A packaged semiconductor device includes a lead frame having a plurality of leads; a semiconductor die mounted onto the lead frame; and an encapsulant surrounding the semiconductor die. At least a portion of each of the leads is surrounded by the encapsulant, wherein, each lead includes a thin portion external to the encapsulant and a thick portion that is surrounded by the encapsulant, wherein the thin portion is thinner than the thick portion.

16 Claims, 5 Drawing Sheets

(56) References Cited

U.S. PATENT DOCUMENTS

| | | | |
|---|---|---|---|
| 5,619,065 A * | 4/1997 | Kim | 257/673 |
| 5,635,755 A * | 6/1997 | Kinghorn | 257/666 |
| 5,659,950 A * | 8/1997 | Adams et al. | 29/827 |
| 6,054,753 A * | 4/2000 | Inaba | 257/646 |
| 6,794,740 B1 | 9/2004 | Edwards et al. | |
| 7,064,008 B2 * | 6/2006 | Abbott et al. | 438/111 |
| 7,196,402 B2 * | 3/2007 | Cherian | 257/666 |
| 7,489,026 B2 | 2/2009 | Wang et al. | |
| 7,901,995 B2 * | 3/2011 | Cherian | 438/123 |
| 2005/0280158 A1 * | 12/2005 | Crane et al. | 257/773 |
| 2010/0193922 A1 * | 8/2010 | Kastner | H01L 23/49551 257/676 |

FOREIGN PATENT DOCUMENTS

| | | | |
|---|---|---|---|
| JP | 61-269345 A * | 11/1986 | |
| JP | 62-46549 * | 2/1987 | |
| JP | 63-107124 * | 5/1988 | |
| JP | 1-200659 * | 8/1989 | |
| JP | 2-12861 * | 1/1990 | |
| JP | 5-315503 A * | 11/1993 | |
| JP | 1-139917 A * | 6/1999 | |

* cited by examiner

PACKAGED SEMICONDUCTOR DEVICE

BACKGROUND

1. Field

This disclosure relates generally to semiconductor devices, and more specifically, to packaged semiconductor devices with lead frames.

2. Related Art

Some types of packaged semiconductor devices include an integrated circuit die mounted on a lead frame. Lead frames are commonly manufactured by stamping/punching preformed sheets of metal such as copper, copper alloys, and iron-nickel alloys into desired shapes. Lead frames may also be made by etching the preformed sheets. Lead frames may also be made by plating metal in a desired pattern onto a carrier that is subsequently removed.

The lead frame includes conductive leads that extend from close proximity to the die to beyond the outer edges of the package body. Wire bonds are formed between the die and the lead frame to form a die assembly that connects the die to bond pads on the lead frame. The die assembly is then placed in a mold that encases the die and the wire bonds or other electrical attachments. Mold compound is inserted or injected into the mold. Mold encapsulant is formed around the die and the wire bonds to protect the die and wire bonds from corrosion, water, and external forces that may damage the die or break the wire bonds.

The ends of the leads that extend outside of the encapsulant are bent so that a foot portion of the lead can be soldered to contacts on a substrate such as a printed circuit board. In some situations, the assembly is subjected to wide variations in temperature, which causes the substrate to expand and contract at rates that are different than the encapsulated die assembly, placing stress on the bonds between the leads and the substrate. It is therefore desirable to provide assemblies that can operate is in wide temperature ranges without breaking contact between one or more of the leads and a corresponding contact on the substrate.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments of methods are disclosed that provide semiconductor devices with lead frame leads that have a thinned or reduced cross-sectional area that extends beyond the molded portion of an integrated circuit (IC) package. The leads may be thinned from the top or bottom surfaces, or partially thinned from both top and bottom surfaces. Alternatively, the leads may be narrowed from either or both edges of the lead. For a pre-plated lead frame (PPF), the process of thinning or narrowing the leads occurs prior to plating. For a lead frame that is unplated except for silver plating on specified regions, the thinning or narrowing can be performed prior to silver plating. The leads with regions having reduced cross-section can bend more easily with displacements due to temperature variations, thus reducing the stress imposed on the connection formed between the ends of the leads and contacts on the substrate. Reliable bonds between the leads on an IC package and a substrate such as a printed circuit board can thus be maintained even when used in environments subject to extended temperature variations.

Figure 1:
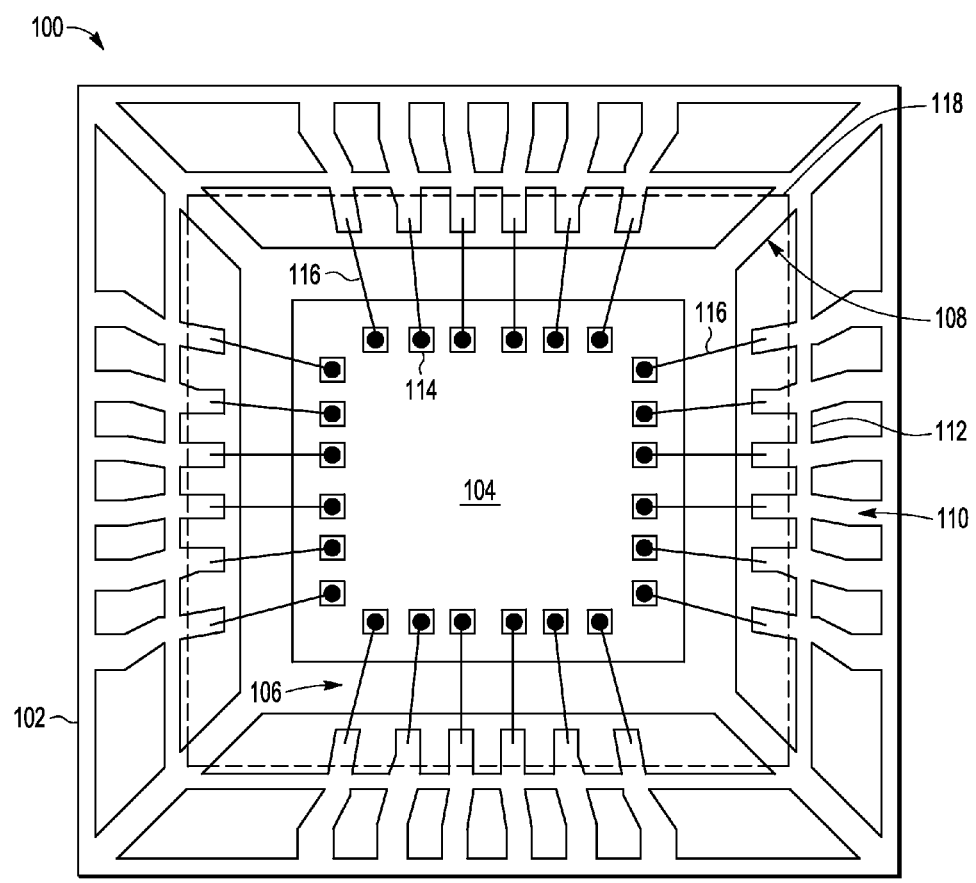
FIG. 1 is a top view of an embodiment of a portion of a packaged semiconductor device during one stage of manufacture.

FIG. 1 is a top view of an embodiment of a semiconductor device 100 including lead frame 102 with an integrated circuit (IC) die 104 attached to flag 106. Tie bars 108 connect flag 106 and leads 110 to lead frame 102. Flag 106 is shown in the center of lead frame 102 and tie bars 108 extend from corners of flag 106 to respective corners of lead frame 102. Conductive leads 110 extend from close to the outer perimeter of flag 106 to the tie bars 108 at the perimeter edges of lead frame 102. Lead frame 102, IC die 104, and flag 106 are shown as square shapes, but can have any suitable shapes and dimensions.

Lead frame 102 can be made by stamping and etching preformed metal sheet stock. Further, lead frame 102 can be coated with a final finish. For example, lead frame 102 can be a Pre-Plated Lead frame (PPF) plated with Ni—Pd—Au, Ni—Pd—Au/Pd, Ni—Pd—Au/Ag, etc. As another example, lead frame 102 can be a bare copper lead frame plated with silver on selected locations to enable wire bonding, and with tin after being encapsulated with a molding compound. Additionally, components with exposed leads can be coated with organic solder preservative. Other suitable configurations of lead frames 102 can be used.

Encapsulant 118 can include a single or combined epoxy resin with a single or combined hardener, filler, adhesion promoter, curing catalyst, and flow agent. Dam bars 112 can be included between leads 110 to help prevent encapsulant 118 from flowing past a desired point along leads 110. Once the encapsulant 118 has hardened, dam bars 112 and tie bars 108 are removed to decouple leads 110 from one another, mechanically and electrically.

Figure 2:
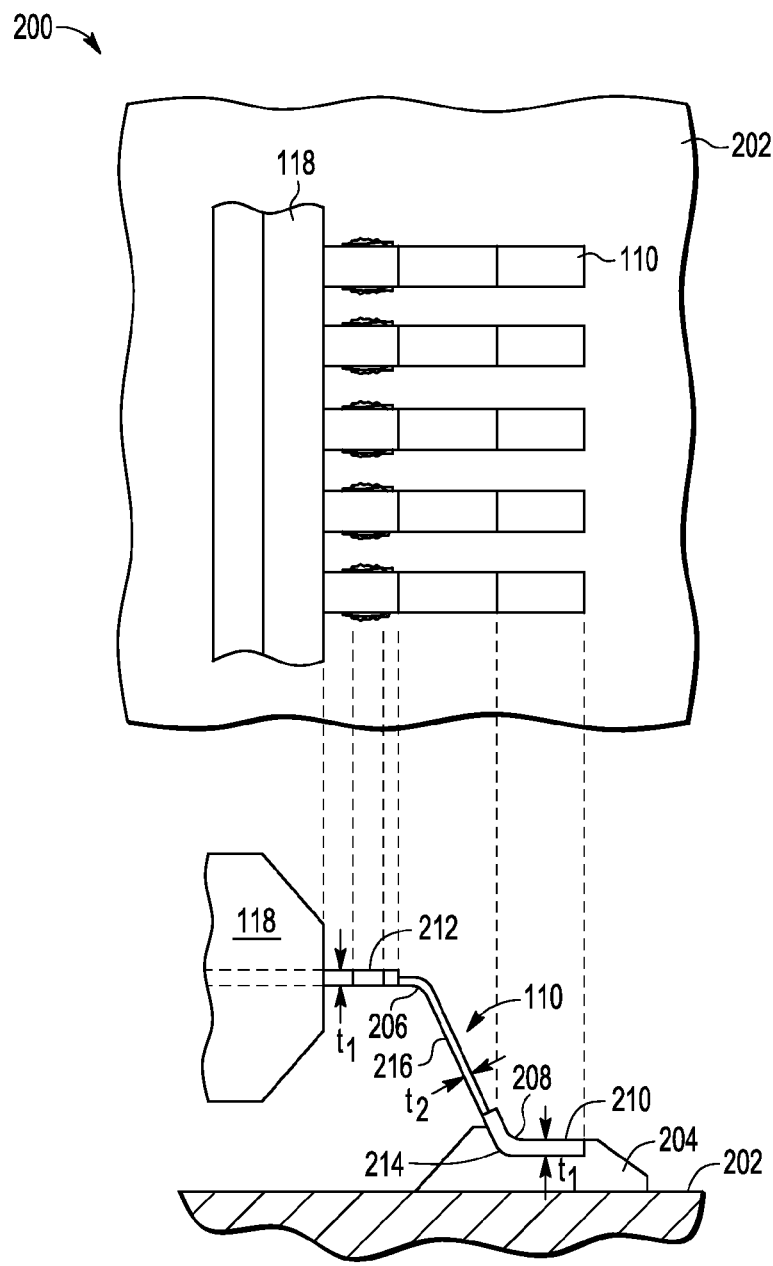
FIG. 2 shows top and side cross-sectional views of an embodiment of leads on a portion of the lead frame 102 of FIG. 1 after a subsequent stage of manufacture.

FIG. 2 shows top and side cross-sectional views of an embodiment of semiconductor device 200 with leads 110 on a portion of the lead frame 102 after a subsequent stage of manufacture in which tie bars 108 and dam bars 112 (FIG. 1) have been removed. Additionally, with reference to the cross-section view of lead 110, leads 110 have been bonded to substrate 202 with solder compound 204 or other suitable attachment material. Leads 110 external to encapsulant 118 are shaped to include top region 212 adjacent to the periphery of encapsulant 118, a first bend at knee region 206 adjacent to top region 212, intermediate region 216 adjacent knee region 206, heel/ankle region 208 adjacent intermediate region 216, and foot region 210 adjacent heel/ankle region 208. When viewed from the perspective in FIG. 2, lead forming operations that define the lead shapes at knee region 206 and heel/ankle region 208 result in intermediate region 216 forming an angle between 0 and −90 degrees with respect to the horizontal. Intermediate region 216 typically follows a straight line between knee region 206 and heel/ankle region 208. The initial bend angle of heel/ankle region 214/208 is typically greater than zero and less than 90 degrees with respect to vertical. Top region 212 is typically horizontal. Foot region 210 is typically close to horizontal, with the foot region forming an angle with the surface of the substrate 202 between 0 and 15 degrees. The radius of curvature of knee region 206 typically ranges from 50 to 300 micrometers. The radius of curvature of heel/ankle region 214/208 typically ranges from 50 to 300 micrometers. The radius of curvature of the knee region 206 and heel/ankle region 214/208 may change during flexure of substrate 202 and/or movement of lead frame 102 relative to substrate 202.

The bond between foot region 210 and substrate 202 can be formed at any suitable temperature and will set the initial bend angle of knee region 206 and heel/ankle region 214/208. The bond is established by the action of wetting portions of heel/ankle region 214/208 and foot region 210 with solder 204, while also wetting an appropriate region on substrate 202 with solder 204. The subsequent solidification of solder 204 forms a mechanical link between lead 110 and substrate 202. The mechanical connection of solder 204, the bulk thickness of solder 204, and the mechanical connection of solder 204 to the appropriate region on substrate 202 define a bond region. The initial bend angles and length of intermediate region 216 can be selected to allow lead 110 to sufficiently increase or decrease the bend at knee region 206, and increase or decrease the flexure in the intermediate region 216 during an imposed thermo-mechanical stress due to the difference in thermal expansions of the encapsulant 118 and/or components in encapsulant 118 and the substrate 202, or a mechanical stress imposed on device 100, such as during flexure of substrate 202, to avoid breaking the bond between foot region 210 and substrate 202.

Knee region 206 and intermediate region 216 of leads 110 have a reduced cross-section or thickness compared to heel/ankle region 208 and foot region 210 of lead 110. Top region 212 extends externally from encapsulant 118 with a first thickness t1. Intermediate region 216 and knee region 206 have a second thickness t2 that is smaller than the first thickness t1. Ankle/heel region 214 and foot region 210 have the same thickness t1 as top region 212, however, ankle/heel region 214 and foot region 210 can have another thickness other than t1 that is thicker than second thickness t2.

The solder material 204 between ankle/heel region 214 and foot region 210 can provide a relatively rigid bond between lead 110 and substrate 202. The stiffness of leads 110 is proportional to the width of the leads and the cube of the thickness of the leads. During periods of thermal cycling, substrate 202 may expand or contract relative to the encapsulant 118 (FIG. 1) and components within encapsulant 118, putting stress on leads 110 that is transferred, in part, to the bond region. The portion of the stress transferred to the bond region is inversely proportional to the compliance of lead 110. The compliance may principally be shown by the change in the radius of curvature in region 206, flexure in region 216, and flexure of region 212 out of the horizontal. In previously known devices, the thermal stress can cause one or more of the bonds between leads 110 and substrate 202 to break, resulting in reduced reliability of semiconductor device 100. The broken bond may mainly occur in one of three locations in the bond region including (a) the interface between solder 204 and regions 214, 208 and 210 of the lead; (b) the bulk volume of solder 204; or (c) the interface between solder 204 and substrate 202. The reduced thickness of knee region 206 and intermediate region 216 decreases stiffness of the leads 110 and allows the portion of leads 110 with thickness t2 to bend back and forth in response to expansion or contraction of substrate 202. The increased flexibility of the leads 110 makes it less likely that the bond between lead 110 and substrate 202 will break during thermal cycling.

The formula for stiffness of a rectangular beam is shown in Equation (1):

$$F=([Ewt^3]/[4L^3])(d)=(\text{Stiffness})(d) \qquad \text{Equation (1)}$$

where F is Force, E is the modulus of elasticity, w is the width of the lead, t is the thickness of the lead, L is the length of the lead, and d is the displacement of the lead. A ten percent reduction in thickness of the leads 110 translates to an almost 30 percent reduction in stiffness. A 50 percent reduction in thickness of the leads 110 translates to almost ninety-percent reduction in stiffness. Accordingly, in some embodiments, the thickness t2 of leads 110 may range from approximately 50 to 90 percent of the thickness t1. Other suitable thicknesses may be used.

Any suitable technique for reducing the cross-section or thickness of knee region 206 and intermediate region 216 such as etching, stamping or laser ablation can be used. In one implementation, etchant such as copper chloride, ferric chloride, or ammonium chloride, can be used to reduce the thickness some or all of knee region 206 and intermediate region 216 to thickness t2. The etchant can be sprayed or deposited on the knee region 206 and intermediate region 216. Portions of the top of lead frame 102 can be masked with photoresist or other etch non-selective material to avoid reducing the thickness of the lead frame 102 in regions other than knee region 206 and intermediate region 216. The amount of time knee region 206 and intermediate region 216 are exposed to the etchant can be proportional to the desired reduction in thickness.

Figure 3:
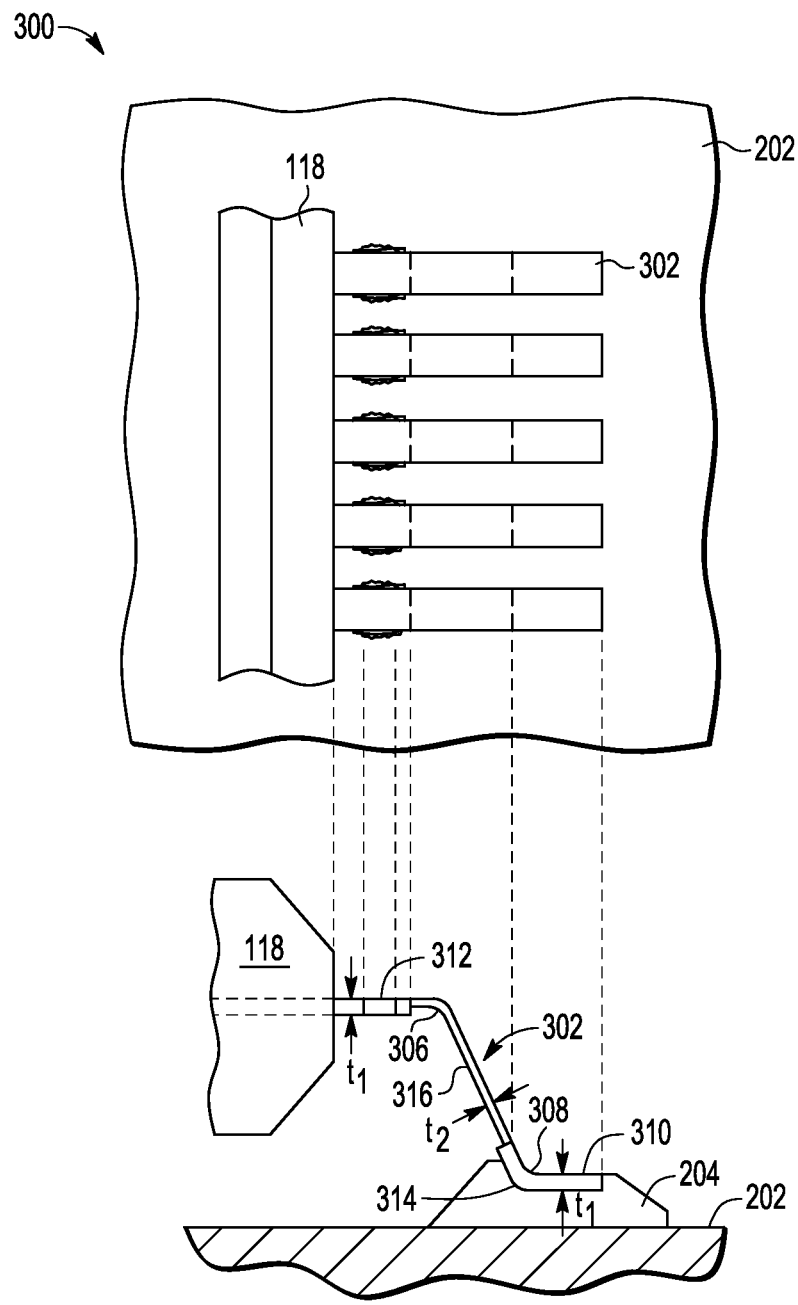
FIG. 3 shows top and side cross-sectional views of another embodiment of leads on a portion of the lead frame of FIG. 1 after a subsequent stage of manufacture.

In the example shown in FIG. 2, the etchant is applied to a top side of intermediate region 216. Similar to the configuration of semiconductor device 200 of FIG. 2, FIG. 3 shows top and side cross-sectional views of another embodiment of a semiconductor device 300 with leads 302 on a portion of the lead frame 102 of FIG. 1 after a subsequent stage of manufacture. Leads 302 external to encapsulant 118 are shaped to include top region 312 adjacent to the periphery of encapsulant 118, a first bend at knee region 306 adjacent to top region 312, intermediate region 316 adjacent knee region 306, heel/ankle region 314/308 adjacent intermediate region 316, and foot region 310 adjacent heel/ankle region 314/308. Instead of the thickness of knee region 306 and intermediate region 316 being reduced from the top as shown for semiconductor device 200 in FIG. 2, an etchant is applied to a bottom side of knee region 306 and intermediate region 316 shown in FIG. 3. Portions of the bottom of lead frame 102 (FIG. 1) can be masked with photoresist or other etch non-selective material to avoid reducing the thickness of the lead frame 102 in regions other than knee region 306 and intermediate region 316. The amount of time knee region 306 and intermediate region 316 are exposed to the etchant can be proportional to the desired reduction in thickness. Other techniques such as stamping or laser ablation can be used to reduce the thickness of leads 302 in selected regions. The initial bend angles and length of intermediate region 316 can be selected to allow lead 110 to sufficiently increase or decrease the bend at knee region 306, and along the length of intermediate region 316, during movement to avoid breaking the bond between foot region 310 and substrate 202.

Figure 4:
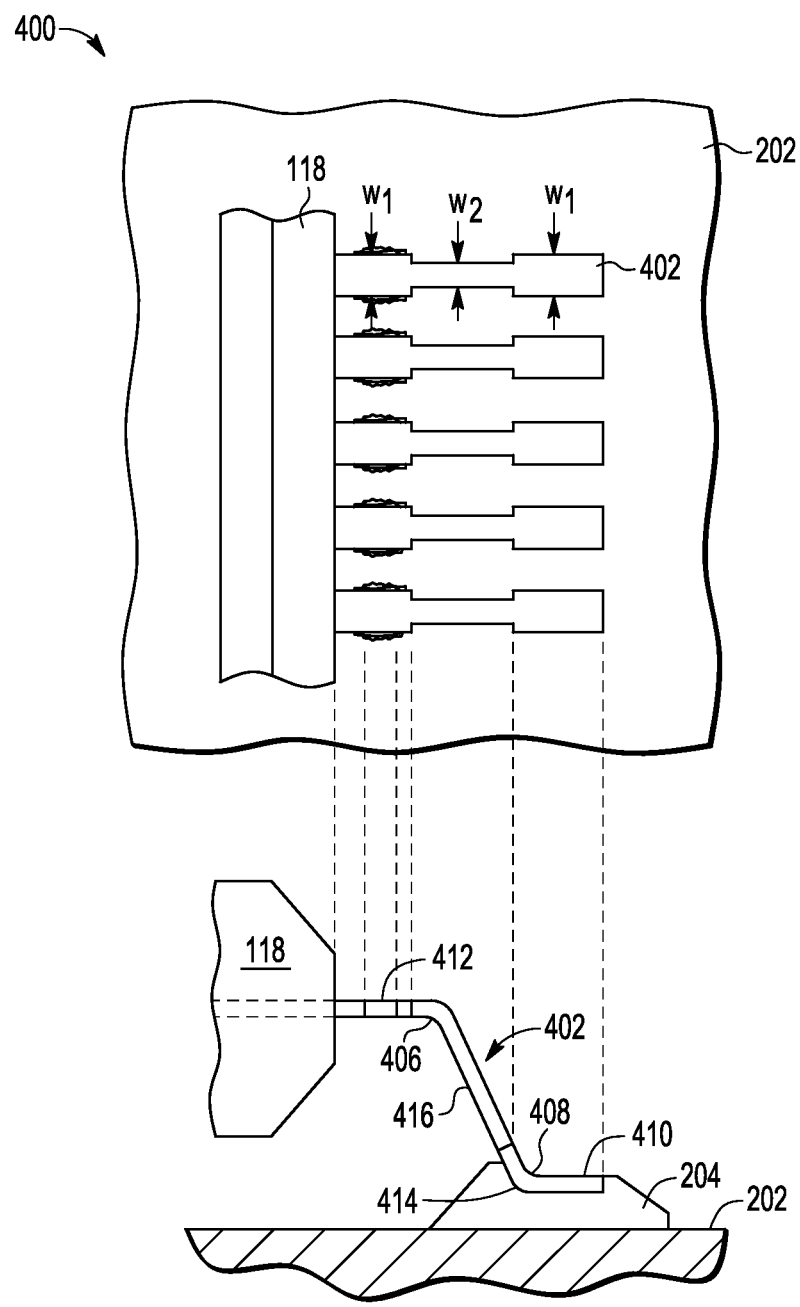
FIG. 4 shows top and side cross-sectional views of another embodiment of leads on a portion of the lead frame of FIG. 1 after a subsequent stage of manufacture.

FIG. 4 shows top and side cross-sectional views of another embodiment of a semiconductor device 400 with leads 402 on a portion of the lead frame 102 of FIG. 1 after a subsequent stage of manufacture. Leads 402 external to encapsulant 118 are shaped to include top region 412 adjacent to the periphery of encapsulant 118, a first bend at knee region 406 adjacent to top region 412, intermediate region 416 adjacent knee region 406, heel/ankle region 414/408 adjacent intermediate region 416, and foot region 410 adjacent heel/ankle region 408. Instead of the thickness of knee region 406 and intermediate region 416 being reduced from the top as shown in FIG. 2 or from the bottom as shown in FIG. 3, the width of lead 402 is reduced on left and right sides of knee region 406 and intermediate region 416 shown in FIG. 4 to width w2. Portions of the lead frame 102 (FIG. 1) can be masked with photoresist or other etch non-selective material to avoid reducing the cross-sectional area of the lead frame 102 in regions other than the sides of knee region 406 and intermediate region 416. The amount of time knee region 406 and intermediate region 416 are exposed to the etchant can be proportional to the desired reduction in width. Other techniques such as stamping or laser ablation can be used to reduce the width of leads 402 in selected regions. The initial bend angles and length of intermediate region 416 can be selected to allow lead 110 to sufficiently increase or decrease the bend at knee region 406, and along the length of intermediate region 416, during movement to avoid breaking the bond between foot region 410 and substrate 202.

Note that although reduced thickness t2 and width w2 are shown as being constant, the width of knee regions 206, 306, 406 and intermediate regions 216, 316, 416 can vary between width w1 and w2 in knee regions 206, 306, 406 and intermediate regions 216, 316, 416 while still allowing leads 110, 302, 402 to sufficiently increase or decrease the bend at knee regions 206, 306, 406, and along the length of intermediate regions 216, 316, 416, during movement to avoid breaking the bond between foot regions 210, 310 410 and substrate 202. Additionally, a combination of reduced width and thickness can be used to increase the flexibility of leads 110, 302, 402. In other embodiments, the reduction in thickness can be achieved by removing material from both the top and the bottom sides of the leads 110, 302. In still other embodiments, the reduction in width can be achieved by removing material from only the left or right side of the leads 402, instead of both right and left sides as shown in FIG. 4.

Figure 5:
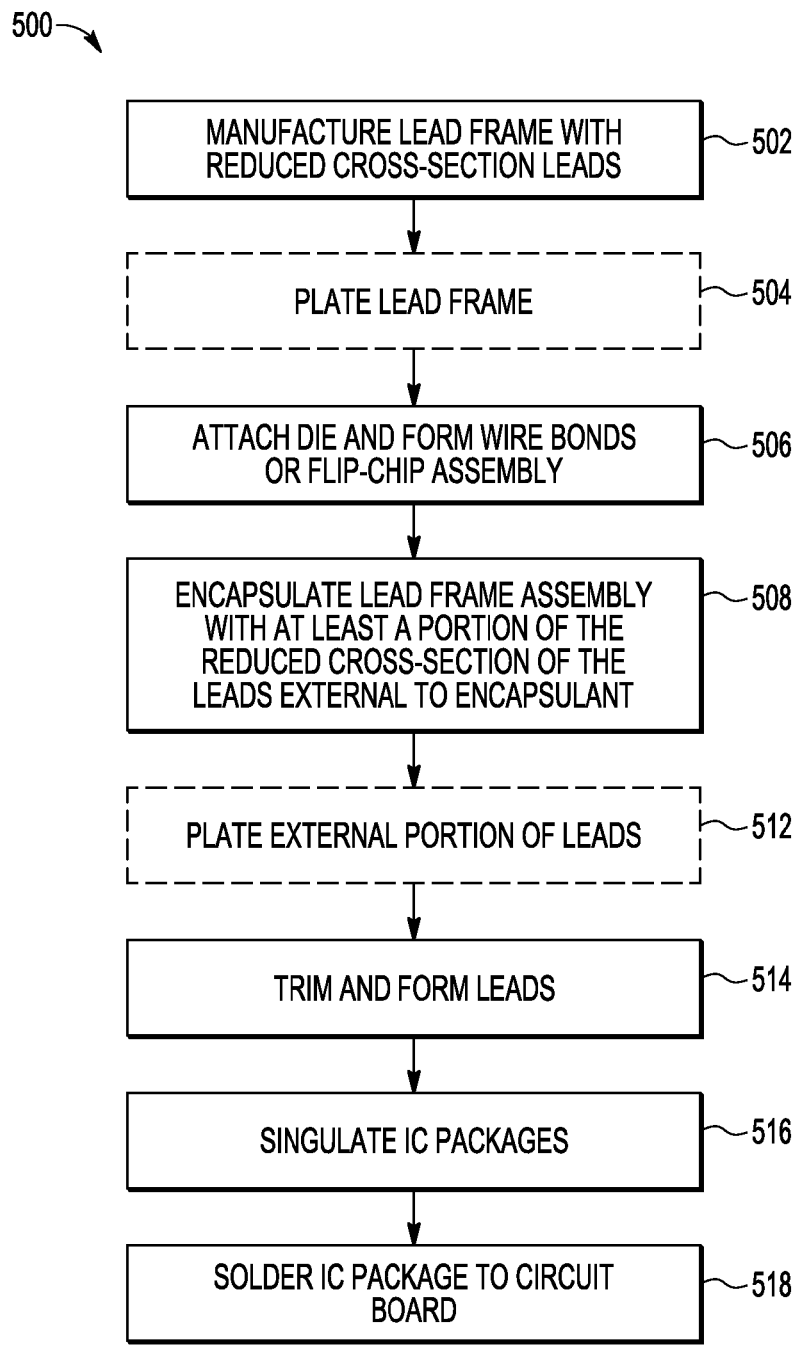
FIG. 5 is a flow diagram of an embodiment of a method for forming a packaged semiconductor device in accordance with the present invention.

FIG. 5 is a flow diagram of an embodiment of a method 500 for forming a packaged semiconductor device in accordance with the present invention. In process 502, lead frame 102 is manufactured by pre-forming a metal sheet. The metal sheet can be formed of copper, copper alloy, or other suitable electrically conductive material. The metal sheet can be 50 to 500 micrometers or other suitable thickness. The knee and intermediate regions of the leads are then reduced in thickness or cross-section. Any suitable technique for reducing the cross-section or thickness of the knee and intermediate regions can be used. In one implementation, an etchant such as copper chloride, ferric chloride, or ammonium chloride, can be used to reduce the thickness some or all of the knee and intermediate regions to thickness t2. The etchant can be sprayed or deposited on the knee and intermediate regions. Portions of the top, bottom and sides of lead frame 102 can be masked with photoresist or other etch non-selective material to avoid reducing the thickness of the lead frame in regions other than the knee and intermediate regions. The amount of time the knee and intermediate regions are exposed to the etchant can be proportional to the desired reduction in thickness.

If the metal sheet is pre-plated, the plating layers can be formed of one or more of silver, nickel, palladium, gold, or other suitable material in process 504. The plating layers can be used to provide a wire bondable surface, and a solderable finish for the leads. As an example, the plating layers can be formed of a layer of nickel that is 0.5 to 3 micrometers thick, a layer of palladium that is 0.01 to 0.05 micrometers thick, and a layer of gold that is 30 to 300 Angstroms thick. Other suitable thicknesses and materials can be used for the plating layers.

In process 506, an integrated circuit (IC) die can be attached to the lead frame and wire bonds formed between bond pads on the IC die and contact areas on the lead frame to form a lead frame assembly. Alternatively, the IC die can include an array of electrically conductive contacts over one surface that mates with an array of electrically conductive contact areas on the lead frame in a configuration referred to as a flip chip assembly. The electrically conductive contacts on the die are connected to the contact areas on the lead frame.

In process 508, the lead frame or flip chip assembly is encapsulated in a protective material. The die assembly can be placed in a mold that encases the die and the wire bonds, contact arrays, or other electrical attachments. Mold compound is inserted or injected into the mold. Mold encapsulant is formed around the die and the electrical attachments to protect the die and electrical attachments from corrosion, water, and external forces that may damage the die or break the electrical attachments. The lead frame can include dam bars that help prevent the encapsulant from leaking out of the mold and spreading further than desired along the length of the leads. The encapsulant can be cured, if required.

If the lead frame was not pre-plated, process 512 can include plating at least a portion of the leads that extend outside the encapsulant to provide a solderable finish for the leads. The plating on the leads can be formed of one or more of tin, silver, nickel, palladium, gold, or other suitable material.

In process 514, the lead frame is trimmed to remove dam bars and tie bars and electrically decouple the leads from one another. Any suitable number of leads 110 can be included on the lead frame based on the dimensions of the lead frame, the width of the leads, and the number of leads required to provide connections between the IC die and components external to the packaged semiconductor device. Process 514 also includes forming bends in the leads for the knee and heel/ankle regions.

When a number of lead frames are connected together, process 516 can include singulating the encapsulated packages from one another by cutting through adjoining leads with a mechanical tool, saw, laser, or other suitable technique.

Once the packaged semiconductor devices are singulated, process 518 can include attaching one or more of the device to a substrate such as a printed circuit board. In some implementations, a solder bond is formed between the foot regions of the leads and electrical contacts on the substrate. By using leads having a reduced cross-sectional area at key bending points such as the knee region of the leads and along the length of the intermediate region between the knee and ankle regions, the bonds between the leads and the substrate are more likely to remain intact even when the assembly is subjected to one or more cycles of extended temperature variations.

By now it should be apparent that there has been provided in some embodiments a packaged semiconductor device (200, 300) that can comprise a lead frame having a plurality of leads (110, 302), a semiconductor die mounted onto the lead frame, and an encapsulant (118) surrounding the semiconductor die. At least a portion of each of the leads is surrounded by the encapsulant. Each lead comprises a thin portion (216, 316) external to the encapsulant and a thick portion (212, 312) that is surrounded by the encapsulant. The thin portion is thinner than the thick portion.

In another aspect, for each lead, a knee region (206, 306) of the lead can extend external to the encapsulant.

In another aspect, for each lead, the knee region can comprise the thin portion of the lead.

In another aspect, for each lead, the thin portion can extend an entire length of the knee region.

In another aspect, for each lead, the thin portion can be located between the knee region and a foot portion.

In another aspect, for each lead, a thickness of the thin portion can be approximately 50% a thickness of the thick portion.

In another aspect, for each lead, a thickness of the thin portion can be in a range of 50-90% of a thickness of the thick portion.

In other embodiments, a method for forming a packaged semiconductor device, can comprise attaching (506) a semiconductor die to a lead frame having a plurality of leads to form a lead frame assembly; and encapsulating (508) the lead frame assembly with an encapsulant. The encapsulant surrounds the semiconductor die and at least a portion of each lead of the plurality of leads. Each of the plurality of leads comprises a thin portion external to the encapsulant and a thick portion that is surrounded by the encapsulant. The thin portion is thinner than the thick portion.

In another aspect, the method can further comprise after the step of encapsulating, forming (514) the leads.

In another aspect, the method can further comprise singulating (526) the encapsulated semiconductor die.

In another aspect, the method can further comprise etching the plurality of leads to form the thin portion of each lead.

In another aspect, the method can further comprise stamping the lead frame to form the thin portion of each lead.

In another aspect, for each lead, a knee region (306, 406) extends external to the encapsulant, wherein the knee region can comprise the thin portion of the lead.

In another aspect, for each lead, the thin portion extends an entire length of the knee region.

In another aspect, for each lead, the thin portion is located between the knee region and a foot portion.

In another aspect, for each lead, a thickness of the thin portion can be approximately 50% of a thickness of the thick portion.

In another aspect, for each lead, a thickness of the thin portion is in a range of 50 to 90% of a thickness of the thick portion.

In another aspect, the method can further comprise plating (504) the lead frame prior to attaching the semiconductor die.

In another aspect, attaching the semiconductor die can comprise forming wire bond connections (506) between the semiconductor die and the lead frame.

In another aspect, attaching the semiconductor die can comprise forming solder bump connections between the semiconductor die and the lead frame.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A packaged semiconductor device, comprising:
   a lead frame having a plurality of leads;
   a semiconductor die mounted onto the lead frame;
   an encapsulant surrounding the semiconductor die, wherein at least a portion of each of the leads is surrounded by the encapsulant, wherein, each lead comprises a knee region of the lead extending external to the encapsulant that is a thin portion and a first thick portion that is surrounded partially by and extends external to the encapsulant and a second thick portion that is a foot portion of the lead, wherein the thin portion is thinner than the first and second thick portions and the thin portion is between the first and second thick portions; and
   a bend in a heel/ankle region of the second thick portion adjacent to the foot portion.

2. The packaged semiconductor device of claim 1, wherein for each lead, the thin portion extends an entire length of the knee region.

3. The packaged semiconductor device of claim 1, wherein for each lead, a thickness of the thin portion is approximately 50% of a thickness of the first and second thick portions.

4. The packaged semiconductor device of claim 1, wherein, for each lead, a thickness of the thin portion is in a range of 50-90% of a thickness of the first and second thick portions.

5. A method for forming a packaged semiconductor device, comprising:
   attaching a semiconductor die to a lead frame having a plurality of leads to form a lead frame assembly;
   encapsulating the lead frame assembly with an encapsulant, wherein the encapsulant surrounds the semiconductor die and at least a portion of each lead of the plurality of leads, wherein each of the plurality of leads comprises a thin portion external to the encapsulant, a first thick portion at one end of the lead that is surrounded partially by and extends from the encapsulant, and a second thick portion at an opposite end of the lead that forms a foot portion, wherein the thin portion is thinner than the first and second thick portions and is between the first and second thick portions; and forming a bend in a heel/ankle region of the second thick portion, wherein the bend is greater than zero and less than 90 degrees with respect to vertical.

6. The method of claim 5, further comprising:
after the step of encapsulating, forming the leads.

7. The method of claim 5, further comprising:
singulating the encapsulated semiconductor die.

8. The method of claim 5, further comprising:
etching the plurality of leads to form the thin portion of each lead.

9. The method of claim 5, further comprising:
stamping the lead frame to form the thin portion of each lead.

10. The method of claim 5, wherein, for each lead, a knee region extends external to the encapsulant, wherein the knee region comprises the thin portion of the lead.

11. The method of claim 10, wherein, for each lead, the thin portion extends an entire length of the knee region.

12. The method of claim 5, wherein, for each lead, a thickness of the thin portion is approximately 50% of a thickness of the first and second thick portions.

13. The method of claim 5, wherein, for each lead, a thickness of the thin portion is in a range of 50 to 90% of a thickness of the first and second thick portions.

14. The method of claim 5, further comprising:
plating the lead frame prior to attaching the semiconductor die.

15. The method of claim 5, wherein attaching the semiconductor die comprises:
forming wire bond connections between the semiconductor die and the lead frame.

16. The method of claim 5, wherein attaching the semiconductor die comprises
forming solder bump connections between the semiconductor die and the lead frame.

\* \* \* \* \*